US 6,975,254 B1

(12) United States Patent
Sperschneider et al.

(10) Patent No.: US 6,975,254 B1
(45) Date of Patent: Dec. 13, 2005

(54) METHODS AND DEVICES FOR CODING OR DECODING AN AUDIO SIGNAL OR BIT STREAM

(75) Inventors: Ralph Sperschneider, Erlangen (DE); Martin Dietz, Nuremberg (DE); Andreas Ehret, Erlangen (DE); Karlheinz Brandenburg, Erlangen (DE); Heinz Gerhaeuser, Waischenfeld (DE); Ali Nowbakht-Irani, Erlangen (DE); Pierre Lauber, Nuremberg (DE); Roland Bitto, Nuremberg (DE)

(73) Assignee: Fraunhofer-Gesellschaft zur Foerderung der angewandten Forschung E.V., Munich (DE)

( * ) Notice: Subject to any disclaimer, the term of this patent is extended or adjusted under 35 U.S.C. 154(b) by 0 days.

(21) Appl. No.: 09/869,401

(22) PCT Filed: Dec. 28, 1998

(86) PCT No.: PCT/EP98/08475

§ 371 (c)(1),
(2), (4) Date: Sep. 5, 2001

(87) PCT Pub. No.: WO00/39933

PCT Pub. Date: Jul. 6, 2000

(51) Int. Cl.[7] ............................................. H03M 7/00
(52) U.S. Cl. .......................... 341/107; 341/50; 704/219
(58) Field of Search .......................... 341/67, 107, 51, 341/50; 704/217, 222, 200.1, 229, 226, 219; 375/246, 240.14; 382/239; 348/390.1

(56) References Cited

U.S. PATENT DOCUMENTS

| | | | | |
|---|---|---|---|---|
| 4,270,025 A | * | 5/1981 | Alsup et al. | 704/217 |
| 4,813,056 A | * | 3/1989 | Fedele | 375/246 |
| 4,815,134 A | * | 3/1989 | Picone et al. | 704/222 |
| 4,942,467 A | * | 7/1990 | Waldman et al. | 375/240.14 |
| 4,972,484 A | * | 11/1990 | Theile et al. | 704/200.1 |
| 5,032,838 A | * | 7/1991 | Murayama et al. | 341/67 |
| 5,146,577 A | * | 9/1992 | Babin | 711/167 |
| 5,222,189 A | * | 6/1993 | Fielder | 704/229 |
| 5,341,457 A | * | 8/1994 | Hall et al. | 704/226 |

(Continued)

FOREIGN PATENT DOCUMENTS

EP    0 492 537 A1    7/1992

(Continued)

OTHER PUBLICATIONS

Watanabe, Hajime; *New International Standard of Multi-channel Stereo Audio Coding*; NHK Technical Information; NHK Technology Center; Sep. 1, 1997, No. 92, pp. 20-27.

(Continued)

*Primary Examiner*—Jean Bruner Jeanglaude
(74) *Attorney, Agent, or Firm*—Michael A. Glenn; Glenn Patent Group

(57) ABSTRACT

In a method for coding an audio signal to obtain a coded bit stream, discrete-time samples of the audio signal are transformed into the frequency domain to obtain spectral values. The spectral values are coded with a code table having a limited number of code words of different lengths to obtain spectral values coded by code words, the length of a code word assigned to a spectral value being that much shorter the higher the probability of occurrence of the spectral value is. A raster is then specified for the coded bit stream, the raster having equidistant raster points and the distance between the raster points depending on the code table(s) used. In order to obtain error-tolerant Huffman coding, priority code words, which represent particular spectral values which are psychoacoustically more important than other spectral values, are so arranged in the raster that the start of each priority code word coincides with a raster point.

30 Claims, 1 Drawing Sheet

U.S. PATENT DOCUMENTS

| | | | | |
|---|---|---|---|---|
| 5,394,144 A | * | 2/1995 | Kim | 341/67 |
| 5,528,628 A | * | 6/1996 | Park et al. | 375/240 |
| 5,563,593 A | * | 10/1996 | Puri | 341/67 |
| 5,579,430 A | | 11/1996 | Grill et al. | |
| 5,650,905 A | * | 7/1997 | Bakhmutsky | 341/67 |
| 5,663,726 A | * | 9/1997 | Bakhmutsky | 341/67 |
| 5,699,117 A | * | 12/1997 | Uramoto et al. | 348/390.1 |
| 5,701,126 A | * | 12/1997 | Kim | 341/67 |
| 5,736,946 A | * | 4/1998 | Sohn | 341/67 |
| 5,835,035 A | * | 11/1998 | Bakhmutsky | 341/67 |
| 6,252,992 B1 | * | 6/2001 | Ishikawa | 382/239 |
| 6,502,069 B1 | * | 12/2002 | Grill et al. | 704/219 |
| 6,879,268 B2 | * | 4/2005 | Karczewicz | 341/67 |

FOREIGN PATENT DOCUMENTS

| | | | | |
|---|---|---|---|---|
| EP | 0492537 A1 | 7/1992 | | |
| EP | 0 612 156 B1 | 8/1994 | | |
| EP | 0 717 503 A2 | 6/1996 | | |
| EP | 0717503 A1 | 6/1996 | | |
| JP | 06-290551 | 10/1994 | | G11B 15/66 |

OTHER PUBLICATIONS

Hosaka, Sanae; Toshio Miki, 3-2 New Development of MPEG-4 Audio, Proceedings of Video Information Media Conference, Apr. 1999, vol. 53, No. 4, pp. 492-493.

Shaw-Min Lei, "The construction of efficient variable-length codes with clear synchronizing codewords for digital video applications," Visual Communications and Image Processing, SPIE, p. 863-873 (Nov. 11, 1991).

* cited by examiner

METHODS AND DEVICES FOR CODING OR DECODING AN AUDIO SIGNAL OR BIT STREAM

This application is the national phase under 35 U.S.C. 371 of PCT International No. PCT/EP98/08475 which has an International filing date of Dec. 28, 1998.

FIELD OF THE INVENTION

The present invention relates to methods and devices for coding or decoding an audio signal or bit stream which are able to perform error-tolerant entropy coding or decoding and in particular error-tolerant Huffman coding or decoding.

BACKGROUND OF THE INVENTION AND PRIOR ART

Modern audio coding or decoding methods, which operate according to the standard MPEG layer 3 for example, are capable of compressing the data rate of audio signals by a factor of 12 for example without causing any noticeable deterioration in the quality of these signals. To obtain such a high data rate reduction an audio signal is sampled, resulting in a sequence of discrete-time samples. As is known in this branch of technology, this sequence of discrete-time samples is windowed using suitable window functions to obtain windowed blocks of temporal samples. A block of temporal windowed samples is then transformed into the frequency domain by means of a filter bank, a modified discrete cosine transform (MDCT) or some other suitable method to obtain spectral values which together represent the audio signal, i.e. the temporal section which consists of the block of discrete-time samples, in the frequency domain. Normally temporal blocks which overlap by 50% are generated and are transformed into the frequency domain by means of an MDCT. Because of the special properties of the MDCT, 1024 discrete-time samples for example always result in 1024 spectral values.

It is known that the receptivity of the human ear depends on the momentary spectrum of the audio signal itself. This dependence is reflected in the so-called psychoacoustic model. Using this model it has long been possible to calculate masking thresholds in dependence on the momentary spectrum. Masking means that a particular tone or spectral portion is rendered inaudible when e.g. a neighbouring spectral region has a relatively high energy. This phenomenon of masking is exploited so as to quantize the post-transform spectral values as coarsely as possible. The aim, therefore, is to avoid audible disturbances in the decoded audio signal while using as few bits as possible to code, or here to quantize, the audio signal. The disturbances introduced by quantization, i.e. the quantization noise, should lie below the masking threshold and thus be inaudible. In accordance with known methods the spectral values are therefore subdivided into so-called scale factor bands, which should reflect the frequency groups of the human ear. Spectral values in a scale factor group are multiplied by a scale factor so as to scale spectral values of a scale factor band as a whole. The scale factor bands scaled with the scale factor are then quantized, producing quantized spectral values. It is of course obvious that a grouping into scale factor bands is not essential. This procedure is, however, used in the standard MPEG layer 3 and in the standard MPEG-2 AAC (AAC=Advanced Audio Coding).

A very important aspect of data reduction is the entropy coding of the quantized spectral values resulting from quantization. A Huffman coding is normally used for this. A Huffman coding entails variable-length coding, i.e. the length of the code word for a value to be coded depends on the probability of this value occurring. As is logical the most probable symbol is assigned the shortest code, i.e. the shortest code word, so that very good redundancy reduction can be achieved with Huffman coding. An example of a universally known variable-length coding is the Morse alphabet.

In audio coding Huffman codes are used to code the quantized spectral values. A modern audio coder which operates e.g. according to the standard MPEG-2 AAC uses different Huffman code tables, which are assigned to the spectrum according to particular criteria on a sectional basis, to code the quantized spectral values. Here 2 or 4 spectral values are always coded together in one code word.

One way in which the method according to MPEG-2 AAC differs from the method MPEG layer 3 is that different scale factor bands, i.e. different spectral values, are grouped into an arbitrarily large number of spectral sections. In AAC a spectral section contains at least four spectral values, preferably more than four spectral values. The whole frequency range of the spectral values is thus divided up into adjacent sections, where one section represents a frequency band, so that all the sections together cover the whole frequency range which is spanned by the post-transform spectral values.

To achieve a maximum redundancy reduction, a so-called Huffman table, one of a number of such tables, is assigned to each section as in the MPEG layer 3 method. In the bit stream of the AAC method, which normally has 1024 spectral values, the Huffman code words for the spectral values are now in an ascending frequency sequence. The information on the table used in each frequency section is transmitted in the side information. This situation is shown in FIG. 2.

In the case chosen to serve as an example in FIG. 2 the bit stream comprises 10 Huffman code words. If one code word is always formed from one spectral value, 10 spectral values can then be coded here. Usually, however, 2 or 4 spectral values are always coded together in a code word, so that FIG. 2 represents a part of the coded bit stream comprising 20 or 40 spectral values. In the case where each Huffman code word comprises 2 spectral values, the code word referenced by the number 1 represents the first two spectral values. The length of this code word is relatively short, meaning that the values of the first two spectral values, i.e. of the two lowest frequency coefficients, occur relatively often. The code word with the number 2, on the other hand, is relatively long, meaning that the contributions of the third and fourth spectral coefficients in the coded audio signal are relatively infrequent, which is why they are coded with a relatively large number of bits. It can also be seen from FIG. 2 that the code words with the numbers 3, 4 and 5, which represent the spectral coefficients 5 and 6, 7 and 8, and 9 and 10, also occur relatively frequently, since the length of the individual code words is relatively short. Similar considerations apply to the code words with the numbers 6–10.

As has already been mentioned, it is clear from FIG. 2 that the Huffman code words for the coded spectral values are arranged in linearly ascending order in the bit stream from the point of view of the frequency in the case of a bit stream which is generated by a known coding device.

A big disadvantage of Huffman codes in the case of error-afflicted channels is the error propagation. If it is assumed e.g. that the code word number 2 in FIG. 2 is disturbed, there is a not insignificant probability that the length of this erroneous code word number 2 will also be changed. This thus differs from the correct length. If, in the example of FIG. 2, the length of the code word number 2 has been changed by a disturbance, it is no longer possible for a decoder to determine where the code words 3–10 start, i.e. almost the whole of the represented audio signal is affected. Thus all the other code words following the disturbed code word cannot be decoded properly either, since it is not known where these code words start and since a false starting point was chosen because of the error.

As a solution to the problem of error propagation European patent No. 0612156 proposes that some of the code words of variable length should be arranged in a raster and the other code words should be assigned to the remaining gaps so that the start of a code word can be more easily identified without complete decoding or in the event of a faulty transmission.

The known method provides a partial remedy for error propagation by resorting the code words. A fixed place in the bit stream is reserved for some code words and the spaces which are left can be occupied by the remaining code words. This entails no extra bits, but prevents error propagation among the resorted code words in the event of an error.

The decisive parameter for the efficiency of the known method is how the raster is defined in practice, i.e. how many raster points are needed, the raster distance between the raster points, etc. However, European patent 0612156 does not go beyond the general proposition that a raster should be used to curtail error propagation; there are no details as to how the raster should be efficiently structured so as to achieve error-tolerant, and at the same time efficient, coding.

EP-A-0 717 503 discloses a digital coding and decoding method in which discrete-time samples of a music signal are transformed into the frequency domain, whereupon the spectral values which are obtained are quantized and then entropy coded. The entropy coding delivers a certain number of code words of variable length, some of which are arranged in a raster while the others are inserted in the remaining spaces in the raster.

EP-A-0 492 537 relates to an information recording device for video and audio information in which information is divided up into small blocks of pixels, each containing a plurality of pixels, whereupon each small block is converted into orthogonal components by means of an orthogonal transformation. The orthogonal components are then coded using a code having code words of variable length. Some of the coded code words are written into a first memory. If a code word has more bits than are provided for by the first memory, the remaining bits of this code word are written into another memory.

SUMMARY OF THE INVENTION

It is the object of the present invention to provide a concept for the error-tolerant and nevertheless efficient coding and decoding of an audio signal or a bit stream.

In accordance with a first object of the present invention, this object is achieved by a method for coding an audio signal to obtain a coded bit stream, comprising the following steps: transforming a block of discrete-time samples of the audio signal into the frequency domain to obtain a block of spectral values which represent the audio signal; coding the spectral values with a code table having a limited number of code words of different length to obtain spectral values coded with code words, the length of a code word which is assigned to a spectral value generally being that much shorter the higher the probability of occurrence of the spectral value is; determining a raster for the coded bit stream where the raster has equidistant raster points and where the separation of the raster points depends on the code table; defining priority code words among the code words, those code words which represent spectral values which are psychoacoustically important compared to other spectral values being defined as priority code words; positioning the priority code words in the raster so that the start of a priority code word which represents a spectral value of the block of spectral values coincides with one raster point and the start of another priority code word which represents another spectral value of the block of spectral values coincides with another raster point.

In accordance with a second object of the present invention, this object is achieved by a device for coding an audio signal to obtain a coded bit stream, comprising: a unit for transforming a block of discrete-time samples of the audio signal into the frequency domain to obtain a block of spectral values which represent the audio signal; a unit for coding the spectral values with a code table having a limited number of code words of different lengths to obtain spectral values coded with code words, the length of a code word which is assigned to a spectral value generally being that much shorter the higher the probability of occurrence of the spectral value is; a unit for determining a raster for the coded bit stream where the raster has equidistant raster points and where the separation of the raster points depends on the code table; a unit for defining priority code words among the code words, those code words which represent spectral values which are psychoacoustically important compared to other spectral values being defined as priority code words; and a unit for positioning the priority code words in the raster so that the start of a priority code word which represents a spectral value of the block of spectral values coincides with one raster point and the start of another priority code word which represents another spectral value of the block of spectral values coincides with another raster point.

In accordance with a third object of the present invention, this object is achieved by a method for decoding a bit stream representing a coded audio signal, where the coded bit stream contains code words of different lengths from a code table and has a raster with equidistant raster points, where the code words include priority code words, which represent particular spectral values of a block of spectral values which are psychoacoustically important compared to other spectral values, where the block of spectral values represents a spectrum of a block of temporal samples of the audio signal, and where priority code words are aligned with raster points so that the start of a priority code word representing a spectral value of the block of spectral values coincides with one raster point and the start of another priority code word representing another spectral value of the block of spectral values coincides with another raster point, comprising the following steps: detecting the distance between two adjacent raster points; resorting the priority code words, which are aligned with the raster points, in the coded bit stream in such a way as to obtain a linear arrangement of the same with frequency, the start of a priority code word coinciding with a raster point; decoding the priority code words with an associated code table to obtain decoded spectral values; and transforming the decoded spectral values back into the time domain to obtain a decoded audio signal.

In accordance with a fourth object of the present invention, this object is achieved by a device for decoding a bit stream representing a coded audio signal, where the coded bit stream contains code words of different lengths from a code table and has a raster with equidistant raster points, where the code words include priority code words, which represent particular spectral values of a block of spectral values which are psychoacoustically important compared to other spectral values, where the block of spectral values represents a spectrum of a block of temporal samples of the audio signal and where priority code words are aligned with raster points so that the start of a priority code word representing the spectral value of the block of spectral values coincides with one raster point and the start of another priority code word representing another spectral value of the block of spectral values coincides with another raster point, comprising: a unit for detecting the distance between two adjacent raster points; a unit for resorting the priority code words, which are aligned with the raster points, in the coded bit stream in such a way as to obtain a linear arrangement of the same with frequency, the start of a priority code word coinciding with a raster point; a unit for decoding the priority code words with an associated code table to obtain decoded spectral values; and a unit for transforming the decoded spectral values back into the time domain to obtain a decoded audio signal.

The present invention is based on the finding that the raster already proposed must be fashioned or occupied in a way that permits efficient coding/decoding as well as error-tolerant coding/decoding. Of prime importance here is the fact that the code words, which are obtained by an entropy coding in the form of a Huffman coding, are inherently of different lengths since the greatest coding gain results when the most frequent value to be coded has a code word of the shortest possible length assigned to it. On the other hand a value to be coded which occurs relatively infrequently, even though it has a relatively long code word assigned to it, results in an optimal amount of data viewed statistically. Code words obtained by a Huffman coding thus have different lengths per se.

According to a first aspect of the present invention so-called priority code words are placed at the raster points so that the start of the priority code words can be identified without fail by a decoder via the raster even if there is an error in the bit stream. Priority code words are code words which are psychoacoustically important. What this means is that the spectral values which are coded by so-called priority code words contribute substantially to the auditory sensation of a decoded audio signal. If the audio signal has a high speech content, the priority code words could be those code words which represent lower spectral values, since in this case the important spectral information is located in the low region of the spectrum. If an audio signal has a group of tones in the middle region of the spectrum the priority code words could be those code words which are assigned to the spectral values in the corresponding middle section of the frequency range, since these are then the psychoacoustically important spectral values. Psychoacoustically important spectral values might also be spectral values whose magnitude, i.e. signal energy, is large compared with that of other spectral values in the spectrum. Code words of less psychoacoustic importance, which are also called non-priority code words, on the other hand, fill up the raster. They are not therefore aligned with the raster points but are "slotted into" the remaining free spaces once the priority code words have been positioned on the raster points.

According to the first aspect of the present invention, therefore, the priority code words, which are assigned to spectral values which are psychoacoustically important, are so arranged in a raster that the start of the priority code words coincides with the raster points.

According to a second aspect of the present invention the spectral values are grouped into spectral sections, a different code table being assigned to each of these spectral sections. The assignment of a code table to a spectral section is made according to signal statistical considerations, i.e. which code table is best suited for the coding of a spectral section. The assignment of a code table to a spectral section is already known in this branch of technology.

A raster will now be employed which consists of several groups of equidistant raster points such that the distance between the raster points of a group of raster points depends on the code table used for coding a spectral section. In another spectral section another code table is used so as to obtain an optimal data reduction. This other code table has a different group of equidistant raster points assigned to it, the distance between two raster points of this other group of raster points depending on the associated code table. The distance between two raster points in the different groups of raster points can be determined in at least three ways.

In the first the maximum length of a code word of a code table is ascertained. The separation of two raster points in the raster point group which is assigned to this code table can now be chosen to be equal to or greater than the maximum code word length in the code table, so that there is room in the raster for even the longest code word of this code table. The separation of two raster points of a different group of raster points, which are associated with a different code table, is determined in an analogous way according to the maximum code word length of this other code table.

The second alternative, which will now be described, can also contribute to an increase in the number of raster points. Because of the inherent properties of the Huffman code, less frequently occurring code words tend to be longer than more frequently occurring code words. When the raster point separation is chosen to be equal to or greater than the length of the code word of maximum length in a table, therefore, the code words inserted in the raster are usually shorter than the raster point separation. The raster point separation can thus also be chosen to be smaller than the length of the longest code word of a table. If a code word which doesn't fit into the raster then appears when coding, the remainder which fails to fit into the raster is inserted into the bit stream at some other suitable position which is not aligned with the raster. As a consequence, this "cut-up" code word is no longer effectively protected against error propagation. Since this occurs very rarely, however, it can be accepted in the interests of an increase in the number of raster points.

The third possibility of determining the different raster point separations is to consider not the maximum code word length of a table but the length of the longest code word in a bit stream which actually occurs in a coded spectral section.

According to a third aspect of the present invention, instead of a code word arrangement in the bit stream which essentially increases linearly with the frequency, an arrangement in which the code words are distributed over the frequency spectrum can be used, a method which is also known as "scrambling". This has the advantage that so-called "burst errors" do not lead to erroneous decoding of a complete frequency band but simply to small disturbances in several different frequency ranges.

According to a fourth aspect of the present invention, instead of a code word arrangement which increases linearly with the frequency an arrangement can also be used in which e.g. only each n-th (e.g. each second, or third or fourth, . . . ) code word is arranged in the raster. In this way it is possible to span the greatest possible spectral region using priority code words, i.e. to protect against error propagation, when the number of possible raster points is less than the number of priority code words.

Furthermore, preference is given to determining the priority code words in such a way as to achieve efficient operation. Preferably this means abandoning the assumption that the psychoacoustically significant code words, i.e. the priority code words, are those which code the spectral values with low frequency. This will often be the case, but does not always have to be so.

Normally priority code words are code words which code psychoacoustically important spectral lines, these usually being spectral values with high energy. It is equally important that spectral lines with high energy do not arise because of errors.

According to the present invention an indicator is used which is already implicitly determined. The indicator depends on the code table which is used. In the AAC standard there are e.g. eleven code tables with different absolute value ranges. The code table No. 1 comprises e.g. spectral values having an absolute value from −1 to +1, while the code table No. 11 can code spectral values from −8191 to +8191. The higher the code table is the greater is the value range which it permits. This means that code tables with low numbers represent only relatively small values, and thus permit only relatively small errors, while code tables with higher numbers can represent relatively large values and thus also relatively large errors.

If an error occurs in a low code table it may well not be audible since an erroneous spectral line results which, seen absolutely, does not differ that much from the originally correct spectral line. If an error occurs in the highest code table, however, this error can in principle assume any of the absolute values in this code table. If a spectral line coded with the highest code table had a small value, for example, and due to an error during transmission is decoded in the decoder as a spectral line with the highest absolute value of this code table, this erroneous spectral line will certainly be audible.

As far as error tolerance is concerned, the most important code table is therefore the highest code table (in the AAC standard the code table No. 11) since this code table permits escape values in the range from $-2^{13}+1$ (−8191) to $+2^{13}-1$ (+8191).

According to a further aspect of the present invention, short windows are used for transient signals in the AAC standard. With short windows the frequency resolution is decreased in favour of a higher temporal resolution. The priority code words are determined in such a way that psychoacoustically significant spectral values, i.e. spectral values at lower frequencies or spectral values from higher code tables, are sure to be placed on raster points. Scale factor band interleaving, a feature of e.g. the AAC standard, is revoked for this purpose.

Preferred embodiments of the present invention are explained in more detail below making reference to the enclosed drawings, in which

DETAILED DESCRIPTION OF THE PREFERRED EMBODIMENTS

Figure 2:
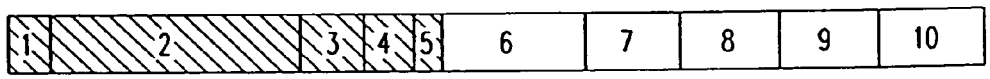
FIG. 2 shows an arrangement of code words which increases linearly with the frequency according to the prior art.

To illustrate the present invention, priority code words are shown hashed in FIG. 2, which represents a known arrangement of code words of different lengths which increases linearly with the frequency. In FIG. 2 priority code words are the code words No. 1–No. 5. As has already been explained above, the code words which are assigned to spectral values of low frequency are priority code words if the audio signal e.g. contains a high speech content or relatively many low-frequency tones. The code words No. 6–10 in FIG. 2 are associated with higher frequency spectral values which, while contributing to the overall impression of the decoded signal, do not greatly affect the auditory sensation and are thus psychoacoustically less significant.

Figure 1:
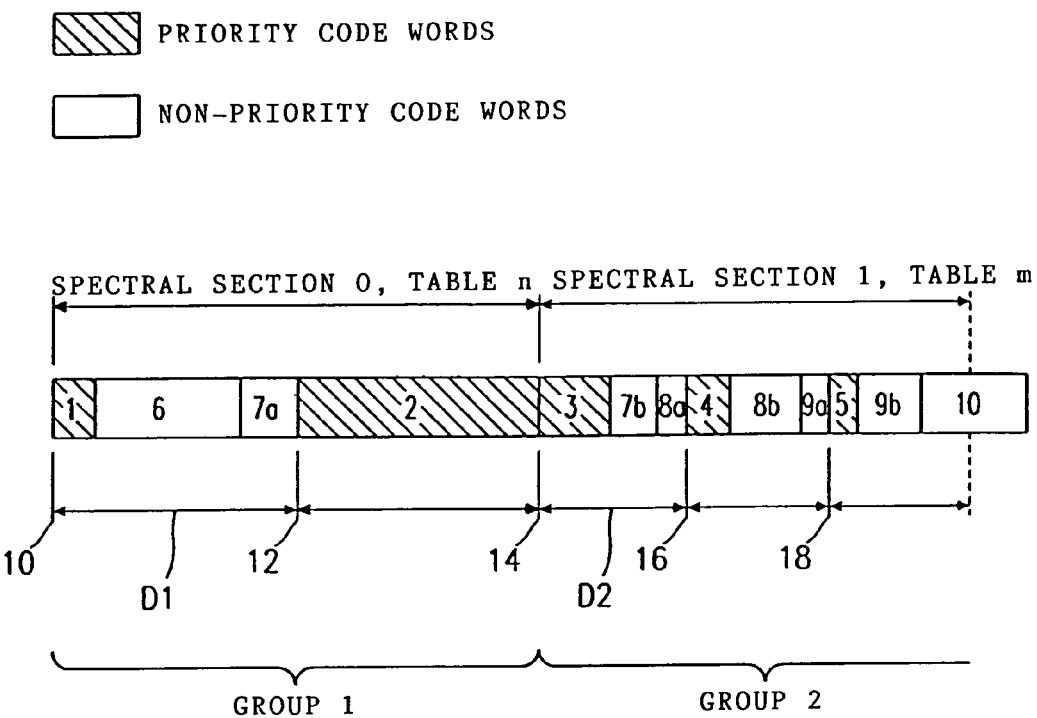
FIG. 1 shows an example of a rastering according to the second aspect of the present invention of a coded bit stream containing code words.

FIG. 1 shows a bit stream with a number of raster points 10–18, where the distance between the raster point 10 and the raster point 12 is labelled D1 and the distance between the raster point 14 and the raster point 16 is labelled D2. As far as exposition of the first aspect of the present invention is concerned, only the part of the bit stream extending from the raster point 10 to the raster point 14 will be considered. The priority code words 1 and 2 are aligned in the raster to ensure that the important spectral portions, which are located in the lower frequency range in the example signal shown in FIG. 2, are not subject to error propagation when decoding. Non-priority code words, which are not hatched in FIGS. 1 and 2, are arranged after the code words so as to fill up the raster. It is not necessary for the non-priority code words to fit into the raster in one piece, since the length of a Huffman code word is known from the word itself. A decoder thus knows whether it has read only part of a code word. In this case it will automatically add to the first part of the code word a certain number of bits following the priority code word after the next raster point. It is therefore possible to insert a first part of a non-priority code word in a first free position in the raster and the remaining part at some other place, as is shown for the non-priority code words 7, 8 and 9, each of which has been subdivided into two in the bit stream, namely into 7a, 7b and 8a, 8b and 9a, 9b. As has already been described, the second part of the bit stream of FIG. 1 illustrates the second aspect of the present invention. If the raster distance D1 were not altered to a smaller raster distance D2, a raster with the spacing D1 in which all the priority code words 1 to 5 are to be arranged would lead to such a long bit stream that there would not, so to speak, be enough non-priority code words to fill up all the spaces remaining in the raster. Therefore only so many priority code words are extracted from an audio signal as can be inserted in the bit stream so that essentially no free places remain, i.e. without causing the bit stream to be extended unnecessarily. The second aspect of the present invention will now be discussed in detail making reference to FIG. 1. In the case of the coding method according to the standard MPEG-2 AAC, 11 different Huffman code tables can be used for the coding. For the majority of these tables the maximum possible code word length lies between 10 and 20 bits. However, a special table, the so-called "escape" table, encompasses a maximum length of 49 bits. If one were to use the length of the longest code word of all the tables as raster distance D, one would have a raster distance of 49 bits, which would result in a raster of very great width and therefore inefficient for nearly all the tables since the bit stream would be far too long if all the priority code words are to be aligned with a raster point. According to the present invention the width of the raster is therefore adjusted in dependence on the code table which is used. As was mentioned previously, spectral values can be grouped into spectral sections, each spectral section then being assigned a code table which is optimally suited to it taking signal statistical aspects into account. The maximum code word length in one code table normally differs from the maximum code word length of another table, however.

It is assumed that the spectral values represented by the code words 1 and 2 belong to a first spectral section while the spectral values represented by the code words 3–10 belong to a second spectral section. The bit stream is then rastered using 2 groups of raster points, the first group of raster points consisting of the raster points 10, 12 and 14, the second group of raster points consisting of the raster points 14, 16 and 18. It is assumed further that the spectral section 0 has been assigned the Huffman code table n and the spectral section 1 has been assigned the Huffman code table m, also that the code word 2 is the longest code word of the table n which has been assigned to the spectral section 0. The raster distance of the first group of raster points is chosen to be greater than or, preferably, equal to the maximum length of the code word of table n, i.e. of the code word 2 in the example. On the other hand from the section of the bit stream between the raster point 14 and the end of the bit stream at code word No. 10 it can be seen that in this example the code word with the maximum length of the code table m does not appear in the bit stream. There is thus no code word of length D2 in the bit stream raster denoted by group 2.

According to the second aspect of the present invention the width of the raster is thus chosen depending on the code table which is used. It should be noted, however, that in this case the table used must already be known when decoding in the decoder. This is the case, however, since a code table number is always transmitted as side information for each spectral section, thus enabling the decoder to identify this code table within a specified set of, in this example 11, different Huffman tables.

As has already been mentioned, optimal data reduction can still not be achieved when the raster distance depends on the code table used, as is plain to see just by considering the escape table, which has a length of 49 bits, since, in the case of an escape table, the raster width is adjusted to 49 bits so as to code spectral values of maximum size. Escape tables are employed in order to have relatively short code tables while being able at the same time to code relatively large values using the short code tables in conjunction with an escape table. In the case of a value which exceeds the value range of a code table, the code word for this spectral value assumes a predetermined value, which indicates to the decoder that an escape table has also been used in the coder. If a code table encompasses the values 0–2, for example, a value of 3 in the code table would indicate to the decoder that an escape table has been accessed. The code word with the value 3 of the "basic" code table is simultaneously assigned an escape table value which, in conjunction with the maximum value of the basic code table, constitutes the corresponding spectral value. According to a further embodiment of the second aspect of the present invention the distance between the raster points of a group (e.g. of the group 1 or group 2) is no longer chosen to be equal to the length of the longest code word of a code table but equal to the length of the longest code word actually occurring in a bit stream which belongs to a code table. This represents a further improvement in respect of the first embodiment of the second aspect of the present invention since the coding efficiency in the escape table is still not optimal despite this method. The maximum length of the code of this table (within a spectrum) is usually considerably shorter for technical coding reasons. The longest code word in the escape table is e.g. 49 bits long.

The longest escape table code word actually occurring in normal audio signals is typically about 20 bits long. It is therefore possible to further increase the number of raster points and thus the number of priority code words which can be aligned with the raster points by transmitting the length of the longest code word of a block. The raster length is then equal either to the actually occurring maximum code word length or the theoretical maximum code word length of the table currently being used, whichever has the minimum value. To determine the minimum it is possible to use either the actually occurring code word of each code table or simply the longest code word of all the code tables in an audio frame. This option also works for non-escape tables, i.e. for "basic" Huffman tables, but not nearly as efficiently as for the escape tables.

Transmitting the maximum length of a code word in a spectral section or block has another beneficial side effect. The decoder can then detect from the maximum length which has actually occurred whether a longer code word is present in a bit stream which may have been disturbed. Long code words normally signify a high energy of the spectral values. If a very long code word arises due to a transmission error this may result in a highly audible disturbance. Transmitting the maximum length thus provides the means of detecting such an error in the majority of cases and of adopting countermeasures, which might be simply blanking out the excessively long code word or might be some more complicated form of concealment.

It is important to note that as many raster points as possible are wanted for error-tolerant and at the same time efficient coding. The number of raster points is, however, limited by the total length of the bit stream. This should not of course be lengthened as a result of mastering, since there would then be unused places in the bit stream, something which would contradict the philosophy of overall data compression. However, it must also be pointed out that a lengthening of the bit stream may well be accepted in the interests of a high degree of error tolerance in certain applications. Another point to be considered is that a raster should preferably be structured so that as many code words as possible start on raster points. The present invention thus permits effective flexibility in the choice of raster point distance as compared with the prior art. In the absolutely ideal case this flexibility would lead to each code word having a raster point assigned to it, something which involves considerable technical effort. The method of arranging the raster points, i.e. determining the distance between the raster points of each spectral section according to the relevant code table, permits a very close approximation to the optimal case, however, especially since not all the code words are psychoacoustically significant and since all the psychoacoustically less significant code words can be slotted into the bit stream between the rastered psychoacoustically significant code words so as to leave no unused places in the bit stream.

According to a third aspect of the present invention the code words are no longer arranged in the bit stream in a linearly increasing sequence as regards frequency but the code words for different spectral values are "scrambled". In FIG. 1 it can be seen that there is to a certain extent an interleaved linear arrangement of the code words with frequency since the hatched priority code words are arranged in order of increasing frequency and the nonpriority code words, which are not hatched, are also slotted into the bit stream in order of increasing frequency. If a so-called "burst" error were now to occur in the bit stream shown in FIG. 1, i.e. a disturbance which leads to the corruption of a number of successive code words, the code words 6, 7a, 2, 3 and 7b for example could be affected simultaneously.

In the corresponding decoded audio signal a disturbance which is spectrally relatively wide and thus likely to be distinctly audible would occur in the spectral band represented by the priority code words 2 and 3. The problem of burst errors is not very apparent from the very simple example in FIG. 1. In practice, however, it can be assumed that there will be many more than 5 raster points and that burst errors will often extend over a plurality of raster points, which can lead to a loss of data for a relatively wide frequency band. It is for this reason that, according to the third aspect of the present invention, the priority code words of the spectral values are preferably no longer arranged in ascending order as to frequency but are "mixed up" in such a way as to have a random or pseudo-random arrangement as regards frequency. The nonpriority code words may also optionally be treated in the same way. In the case of a pseudo-random arrangement it is not necessary to transmit any information on the distribution as side information since this distribution can be set in the decoder a priori. As a consequence the loss of successive code words in the bit stream would not lead to the loss of a complete frequency band but simply to a very small loss in several frequency bands. This disturbance would scarcely be audible and could also be concealed more efficiently than the loss of a complete frequency band.

According to a fourth aspect of the present invention, instead of an arrangement of the priority and non-priority code words which increases linearly with the frequency an arrangement can also be used in which e.g. only each n-th code word is arranged in the raster and the remaining code words are slotted between them. As has already been stated, the number of raster points for a bit stream is limited by the total length and the distance between the raster points. If e.g. sampling with low bandwidth is considered, the case can occur that the vast majority of the code words are psychoacoustically significant code words since the whole signal has a theoretically possible useful bandwidth of 8 kHz if a sampling rate of 16 kHz is used. Experience shows that only 30% of the code words can be arranged on raster points, the other 70% being required to fill up the raster completely. This would mean, however, that the important frequency range, the range 0–4 kHz for speech signals e.g., cannot be covered or "protected" with priority code words arranged on raster points. To achieve adequate protection against error propagation for the important frequency range, therefore, instead of aligning every priority code word with a raster point this is done only for every second, third, fourth, etc. priority code word, while the other priority code words fill up the raster without being aligned. If e.g. every second or every third etc. spectral value is known in the low frequency range and the interspersed code words are corrupted during transmission, it may be possible to reconstitute these code words in the decoder using error concealment techniques, e.g. prediction or similar.

The methods and devices for decoding a bit stream operate in such a way as to reflect the cited coding.

In a general method for decoding a bit stream representing a coded audio signal where the coded bit stream has code words of different length from a code table and a raster with equidistant raster points (10, 12, 14), where the code words include priority code words which represent certain spectral values which are psychoacoustically important compared with other spectral values and where priority code words are aligned with raster points, (a) the distance D1 between two adjacent raster points is determined. If the distance between two raster points is known, (b) the priority code words in the coded bit stream which are aligned with the raster points can be resorted so as to obtain an arrangement in which they are ordered linearly as regards frequency and the start of a priority code word coincides with a raster point. The priority code words now appear in the general frequency-linear arrangement shown in FIG. 2, so that (c) the priority code words can now be decoded with a code table with which they are associated so as to obtain decoded spectral values. After (d) transforming the decoded spectral values back into the time domain, a decoded audio signal is obtained, which can be processed in some known way, e.g. in order to feed it into a loudspeaker.

If the bit stream is coded with just one code table, the distance between the raster points can be established quite simply by finding out from the side information of the bit stream which table was used for coding. Depending on the coding, the distance might then be the length of the longest code word of this table, which could be set permanently in the coder. If the distance is the length of the longest code word actually occurring in a part of the bit stream to which a code table is assigned, this is communicated to the decoder in the side information which is assigned to the bit stream, and so on.

The decoder performs a resorting of the priority code words and also of the non-priority code words, e.g. by applying a pointer to the coded bit stream. If the raster distance is known to the decoder and the priority code words are arranged linearly with frequency, the decoder can jump to a raster point and read the code word which starts there. Once a code word has been read the pointer jumps to the next raster point and repeats the process just described. After all the priority code words have been read, the bit stream still contains the non-priority code words. If a linear arrangement of the priority code words and the non-priority code words in the bit stream was chosen, the non-priority code words are already arranged linearly with frequency and can be decoded and transformed back without further sorting.

If coding according to the third or fourth aspect of the present invention has been chosen, either scramble information can be transmitted as side information or the scrambled distribution is fixed a priori and is thus known to the decoder from the start. The same considerations apply to the fourth aspect. It is always possible to stipulate a fixed distribution or to choose a variable distribution which is communicated to the decoder as side information.

An advantageous way of determining and manipulating the priority code words will now be discussed. After establishing a raster for a coded bit stream, either by specifying the raster distance when using just one code table or the raster distances when using a number of code tables, the priority code words must be so positioned in the raster that each priority code word coincides with a raster point.

According to a preferred embodiment of the present invention this positioning is achieved by inserting the code words sequentially into the essentially empty raster from a kind of sort table. A start is made with the first code word in the table. The priority code words can thus be influenced by the ordering of the code words in the table, priority code words always being those code words in the table with a place in the raster, i.e. for which raster points are available. For code words in the table for which there are no further raster points, there is no choice but to insert them in the remaining free places in the bit stream. These code words are thus not priority code words in the sense of the present invention.

The number of priority code words is not determined in advance. Priority code words are written until the memory available for the coded bit stream is full, i.e. until no further priority code word can be written. The size of the memory is equal to the total number of bits previously used for the spectral data, i.e. no further bits are required by the rastering. The memory is thus limited by the number of code words to prevent the coding efficiency falling off as a result of raster ordering. All the code words could, of course, be placed on raster points to make them error tolerant. However, this would lead to a marked decrease in the coding efficiency since the free bits remaining between the raster points are not used.

The first aspect of the present invention relates to determining the priority code words, i.e. the code words which represent the spectral values which are psychoacoustically important compared with other spectral values. A psychoacoustically important spectral line is e.g. a spectral line which contains more energy than another spectral line. Generally speaking it can be said that the more energy a spectral line has the more important it is. Thus it is important that spectral lines with high energy are not disturbed and equally important that spectral lines with high energy do not result from errors.

Until now it has been assumed that the spectral lines with high energy are located primarily in the lower part of the spectrum. This is true in many cases but not in all. The present invention ignores this assumption by using an implicit indicator to estimate the energy of the coded spectral line in a code word, or of the spectral lines if a number of spectral lines are coded in a code word.

This indicator is the code book or code table, e.g. a Huffman code table, which is used. In the AAC standard eleven tables e.g. are used. The value ranges of these tables differ considerably. The maximum absolute values of the tables 1 to 11 are as follows:

1; 1; 2; 2; 4; 4; 7; 7; 12; 12; 8191.

As a result of these different value ranges, the maximum error depends on the table. Taking account of the sign for each table, which is either explicitly available in the table or is transmitted outside the table, the maximum error amounts to twice the cited absolute value. According to the present invention the determination of the priority code words is effected on the basis of the code table which is employed, the indicator being the highest absolute value and implicitly the code table number. At first code words whose code table has the greatest value range are considered. Then follow those code words whose code table has the second greatest value, and so on. In the case of the AAC standard, therefore, table 11 is considered first, followed by tables 9 and 10 and concluding with tables 1 and 2 with the lowest priority. Priority code words, which are placed on raster points, are thus the code words in the sort table for which raster points are available.

An advantage of this method of determining the code words is the fact that no additional information has to be transmitted for the decoder since the tables which are used are transmitted in the side information and from this information the decoder can determine the code word sequence used during the transmission.

The second aspect of the present invention relates to the use of short (sampling) windows as opposed to long windows for transforming discrete-time samples of the audio signal into the frequency domain in order to obtain spectral values representing the audio signal. Short windows are defined in the AAC standard and also in the standard layer 3. In the case of short windows a number of short MDCTs are used instead of one long MDCT.

In the AAC standard a group of eight MDCTs each having 128 output values is used e.g. instead of an MDCT with 1024 output values. This results in an increase in the temporal resolution of the coder at the expense of the frequency resolution. Generally short windows are used for transient signals. If short windows are used with AAC for example, eight successive complete spectra, i.e. eight sets of spectral values, are obtained, each set of spectral values encompassing the whole spectrum. In contrast to the long windows, however, the distance between the spectral values is also eight times as big. This represents the diminished frequency resolution, which, however, is accompanied by a higher temporal resolution.

In the AAC standard a grouping is performed, i.e. groups are formed from the eight spectra. For each of these groups there is a set of scale factors. In the simplest case each group contains just one window. In this case eight scale factor sets must be transmitted. To achieve stronger compression, a plurality of windows is concentrated in a group in the AAC standard, generally taking account of psychoacoustic requirements. This reduces the number of scale factors to be transmitted, resulting in a better data compression. The spectral data are transmitted, i.e. written into a coded bit stream, sequentially group by group. Within the groups scale factor band interleaving is performed.

This may be demonstrated by the following example. Here there has been grouping into three groups. The first group contains two windows, the second group contains three windows and the third group also contains three windows. Each spectrum has 12 scale factor bands. The grouping is then as follows:

$1^{st}$ group, $1^{st}$ window, $1^{st}$ scale factor band
$1^{st}$ group, $2^{nd}$ window, $1^{st}$ scale factor band
$1^{st}$ group, $1^{st}$ window, $2^{nd}$ scale factor band
$1^{st}$ group, $2^{nd}$ window, $2^{nd}$ scale factor band
. . .
$1^{st}$ group, $2^{nd}$ window, $12^{th}$ scale factor band
$2^{nd}$ group, $3^{rd}$ window, $1^{st}$ scale factor band
$2^{nd}$ group, $4^{th}$ window, $1^{st}$ scale factor band
$2^{nd}$ group, $5^{th}$ window, $1^{st}$ scale factor band
$2^{nd}$ group, $3^{rd}$ window, $2^{nd}$ scale factor band
. . .

This arrangement is not suitable for presorting or inserting code words from the sort table in the raster, since if sequential insertion is employed the complete spectrum of the first group would be protected but the spectrum of the last group would be completely unprotected. For this reason a presorting according to the second aspect of the present invention is carried out for short windows. In the case of the AAC standard the grouping and the scale factor band approach are abandoned. A new presorting is performed, this time in units of spectral lines.

In a preferred embodiment of the present invention each unit contains 4 spectral lines. In the AAC standard each window therefore contains 32 units, corresponding to 128 spectral lines. The spectral data are arranged as follows:

$1^{st}$ window, $1^{st}$ unit
$2^{nd}$ window, $1^{st}$ unit
. . .
$8^{th}$ window, $1^{st}$ unit
$1^{st}$ window, $2^{nd}$ unit $2^{nd}$ window, $2^{nd}$ unit

...

$8^{th}$ window, $2^{nd}$ unit $1^{st}$ window, $3^{rd}$ unit

...

This presorting ensures that the individual spectral regions of all the windows lie near one another, i.e. that low spectral values are written according to frequency from the individual sets of spectral values into the front area of the sort table before the spectral values with higher frequency. If the spectral values in the lower spectral region are particularly important psychoacoustically, the cited presorting in the sort table provides the b asis for inserting the spectral values from the sort table into the raster. With this presorting of the code words, i.e. determining the priority code words, there is no need to transmit any additional information since the decoder knows from the side information that short windows were used in this b lock or frame and the sort algorithm in the coder for generating the units is always fixed and is thus permanently programmed in the decoder.

It is important to note that the presorting of code words into a sort table corresponds to determining the priority code words since this table in itself determines which code words can, with a high degree of probability, be written to raster points since the code words which can, with a high degree of probability, be positioned on raster points, i.e. the priority code words, are those code words at the beginning, i.e. at the front or upper region, of the sort table.

Other than in the preferred embodiment this presorting is not performed by means of a sort table but by indexing the individual code words so as to specify the sequence in which the indexed code words are to be written into the bit stream.

From the AAC standard it is known that some code tables are two dimensional or four dimensional, i.e. that a code word codes two or four spectral values. It is therefore advantageous to group four spectral lines or a multiple thereof into a unit, since in this way code words which code the same frequency region can be sorted in direct succession to one another. The number of spectral lines from a unit is thus preferably divisible by the different dimensions of the code tables, i.e. the number of lines per unit must be a common multiple of the number of lines per code word and optimally the lowest common multiple.

The present invention becomes particularly efficient when the first and second aspects are combined. If resorting into units according to the present invention has been performed for short windows, this can be followed by priority code word determination by means of the code table indicator in which the result of unit resorting is resorted again to ensure that the code words from higher code tables become priority code words which are positioned on fixed raster points so as to achieve a high degree of error security. This combination is not absolutely necessary, but it leads to the best results.

What is claimed is:

1. A method for coding an audio signal to obtain a coded bit stream, wherein the bit stream includes code words created by transforming a block of discrete-time samples of the audio signal into the frequency domain to obtain a block of spectral values which represent the audio signal; and coding the spectral values with a code table having a limited number of code words of different length to obtain spectral values coded with code words, the length of a code word which is assigned to a spectral value generally being that much shorter the higher the probability of occurrence of the spectral value is, comprising the following steps:

determining a raster for the coded bit stream where the raster has equidistant raster points and where the separation of the raster points depends on the code table;

defining priority code words among the code words, those code words which represent spectral values which are psychoacoustically important compared to other spectral values being defined as priority code words;

positioning the priority code words in the raster so that the start of a priority code word which represents a spectral value of the block of spectral values coincides with one raster point and the start of another priority code word which represents another spectral value of the block of spectral values coincides with another raster point.

2. A method according to claim 1, wherein a plurality of windows is used, whereby a plurality of sets of spectral values results, where each set of spectral values comprises the complete spectrum; and wherein, in the step of defining priority code words, those code words which code spectral values of the same frequency from the respective sets are defined to be priority code words.

3. A method according to claim 1, wherein a code word of the code table codes a plurality of spectral values, the spectral values being combined into groups or units in such a way that the number of spectral values in a group is divisible by the plurality of spectral values which a code word codes.

4. A method according to claim 3, wherein various code tables with different dimensions, i.e. spectral values per code word, are used, a unit having n spectral values, where n is a common multiple of all the dimensions which occur.

5. A method according to claim 1, wherein, in the step of defining priority code words, the code words which code the spectral values of the sets of spectral values which are assigned to low frequencies are defined to be priority code words.

6. A method according to claim 5, wherein the step of defining priority code words includes the following step:

placing the code words in sequence in a sort table, priority code words being code words in the front part of the sort table and therefore more likely to be positioned on raster points than code words further back in the table, in such a way that the sequence of code words in the sort table constitutes a priority distribution within the code words, thus producing priority code words; and wherein the step of positioning the priority code words includes the following step:

successive positioning of the code words from the sort table on raster points until no raster points are left;

positioning the remaining code words from the sort table at locations in the raster which are still unoccupied.

7. A method according to claim 1, wherein, in the step of defining priority code words, the code words which code spectral values with low frequency and/or high energy are defined to be priority code words.

8. A method according to claim 1, wherein the distance between the raster points is somewhat smaller than, equal to or greater than the longest code word of the code table or is equal to or greater than the longest code word actually appearing in the bit stream.

9. A method according to claim 1, wherein before coding the spectral values grouping the spectral values into adjacent spectral sections is performed, each spectral section having at least one spectral value, and further assigning at least two different code tables from a predetermined number of code tables to two different spectral sections is performed, a spectral section having assigned to it that code table which is best suited for coding the spectral values in the spectral section, wherein, in coding, the spectral values from the spectral sections are coded with the code table which is assigned to the corresponding spectral section; and wherein, in the step of specifying, a raster is specified for the coded bit stream such that the raster has at least two groups of raster points, such that the raster points of each group are spaced equidistantly from one another and such that the raster point distance of each group depends on an appropriate code table from among the at least two different code tables.

10. A method according to claim 9, wherein, in the step of defining priority code words, a code word is defined to be a priority code word when an indicator, which depends on the code table from which the code word originates, indicates priority.

11. A method according to claim 10, wherein each code table has a maximum absolute value for a spectral value which is to be coded; and wherein the indicator indicates the highest priority when the code table on which the indicator depends has the highest absolute value of all the code tables.

12. A method according to claim 9, wherein each code table has a maximum absolute value for a spectral value which is to be coded; and wherein a plurality of code tables is used, where there is an indicator for each table, where the indicator is determined by the highest absolute value of the respective table and where the indicator for a table with a greater maximum absolute value indicates a higher priority for a code word from the table than does an indicator for another table with a smaller maximum absolute value.

13. A method according to claim 9, wherein the raster point distance of each group of raster points is smaller than, equal to or greater than the length of the longest code word of the corresponding code table.

14. A method according to claim 9, wherein the raster point distance of each group of raster points is equal to the length of the longest actually occurring code word for a spectral value in the corresponding spectral section; and wherein the length of the longest actually occurring code word of a spectral section is transmitted as side information to the bit stream.

15. A method according to claim 9, wherein the raster point distance of a group of raster points is so determined as to be equal to the minimum of the longest actually occurring code word of all the grouped spectral sections and the longest code word of the code table of this group, and where the longest actually occurring code word is transmitted to a decoder as side information.

16. A method according to claim 1, wherein a substantially linear arrangement of the code words with frequency is adhered to in the raster of the bit stream both for the priority code words and for the non-priority code words.

17. A method according to claim 1, wherein the code words which represent coded spectral values are arranged in the raster of the bit stream independently of the frequency of the corresponding spectral values.

18. A method according to claim 17, wherein information regarding the correspondence between the frequency and the code word is inserted in the bit stream as side information when the frequency independent distribution is not predetermined.

19. A method according to claim 1, wherein only each n-th code word of the priority code words is arranged in the raster of the bit stream while the remaining priority code words and non-priority code words are not aligned with raster points.

20. A method according to claim 1, wherein the spectral values are quantized prior to coding taking the psychoacoustic model into account.

21. A device for coding an audio signal to obtain a coded bit stream, wherein the bit stream includes code words created by transforming a block of discrete-time samples of the audio signal into the frequency domain to obtain a block of spectral values which represent the audio signaland coding the spectral values with a code table having a limited number of code words of different lengths to obtain spectral values coded with code words, the length of a code word which is assigned to a spectral value generally being that much shorter the higher the probability of occurrence of the spectral value is, comprising:

a unit for determining a raster for the coded bit stream where the raster has equidistant raster points and where the separation of the raster points depends on the code table;

a unit for defining priority code words among the code words, those code words which represent spectral values which are psychoacoustically important compared to other spectral values being defined as priority code words; and a unit for positioning the priority code words in the raster so that the start of a priority code word which represents a spectral value of the block of spectral values coincides with one raster point and the start of another priority code word which represents another spectral value of the block of spectral values coincides with another raster point.

22. A device according to claim 21, wherein before transforming grouping the spectral values into adjacent spectral sections, each spectral section having at least one spectral value, and assigning at least two different code tables from a predetermined number of code tables to two different spectral sections, a spectral section having assigned to it that code table which is best suited for coding the spectral values in the spectral section, is performed, where in coding the spectral values from the spectral sections are coded with the code table which is assigned to the corresponding spectral section;

where the unit for specifying is designed to specify a raster for the coded bit stream such that the raster has at least two groups of raster points, such that the raster points of each group are spaced equidistantly from one another and such that the raster point distance of each group depends on an appropriate code table from among the at least two different code tables.

23. A method for decoding a bit stream representing a coded audio signal, where the coded bit stream contains code words of different lengths from a code table and has a raster with equidistant raster points, where the code words include priority code words, which represent particular spectral values of a block of spectral values which are psychoacoustically important compared to other spectral values, where the block of spectral values represents a spectrum of a block of temporal samples of the audio signal, and where priority code words are aligned with raster points so that the start of a priority code word representing a spectral value of the block of spectral values coincides with one raster point and the start of another priority code word representing another spectral value of the block of spectral values coincides with another raster point, comprising the following steps:

detecting the distance between two adjacent raster points; and reading out or, in the case of a non-linear arrangement with frequency, resorting the priority code words, which are aligned with the raster points, in the coded bit stream in such a way as to obtain a linear arrangement of the same with frequency, the start of a priority code word coinciding with a raster pointso that by decoding the priority code words with an associated code table to obtain decoded spectral values and by transforming the decoded spectral values back into the time domain a decoded audio signal is obtainable.

24. A method according to claim 23, wherein the coded bit stream contains code words of different lengths from at least two code tables and has a raster with at least two groups of equidistant raster points, including the following step:

identifying the code table associated with a spectral section; and where, in decoding, the priority code words of a spectral section are decoded with the corresponding associated code table.

25. A device for decoding a bit stream representing a coded audio signal, where the coded bit stream contains code words of different lengths from a code table and has a raster with equidistant raster points, where the code words include priority code words, which represent particular spectral values of a block of spectral values which are psychoacoustically important compared to other spectral values, where the block of spectral values represents a spectrum of a block of temporal samples of the audio signal and where priority code words are aligned with raster points so that the start of a priority code word representing the spectral value of the block of spectral values coincides with one raster point and the start of another priority code word representing another spectral value of the block of spectral values coincides with another raster point, comprising:

(a) a unit for detecting the distance between two adjacent raster points; and (b) a unit for reading out or, in the case of a nonlinear arrangement with frequency, resorting the priority code words, which are aligned with the raster points, in the coded bit stream in such a way as to obtain a linear arrangement of the same with frequency, the start of a priority code word coinciding with a raster point, so that by decoding the priority code words with an associated code table to obtain decoded spectral values, and transforming the decoded spectral values back into the time domain a decoded audio signal is obtainable.

26. A device according to claim 25, wherein the coded bit stream contains code words of different lengths from at least two code tables and has a raster with at least two groups of equidistant raster points, also comprising:

a unit for identifying the code table associated with a spectral section;

where in decoding the priority code words of a spectral section are decodable with the corresponding associated code table.

27. A device for decoding a bit stream, the bit stream having code words of different lengths from a code table and, as side information, information on the length of the longest actually occurring code word, comprising:

a decoder for decoding the bit stream using the code table, the decoder being operative to detect, whether a code word extracted from the bit stream is longer than the length of the longest actually occurring code word and is, therefore, an erroneous code word, the decoder being further operative to adopt a countermeasure, when such an erroneous code word is detected.

28. A device in accordance with claim 27, in which the decoder is operative to adopt, as the countermeasure, a blanking out or a concealment of the erroneous code word.

29. A device in accordance with claim 27, in which the bit stream represents a coded audio signal, and in which a long code word corresponds to a spectral value of the audio signal having a high energy compared to a comparatively short code word corresponding to a spectral value having a comparatively low energy.

30. A method of decoding a bit stream, the bit stream having code words of different lengths from a code table and, as side information, information on the length of the longest actually occurring code word, comprising:

decoding the bit stream using the code table, the step of decoding including the following substeps:

detecting, whether a code word extracted from the bit stream is longer than the length of the longest actually occurring code word and is, therefore; an erroneous code word; and adopting a coutermeasure, when such an erroneous code word is detected.

* * * * *